United States Patent
Hayashi

(10) Patent No.: US 6,724,585 B2
(45) Date of Patent: Apr. 20, 2004

(54) MAGNETORESISTIVE ELEMENT AND DEVICE UTILIZING MAGNETORESISTANCE EFFECT

(75) Inventor: Kazuhiko Hayashi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/398,773

(22) Filed: Sep. 20, 1999

(65) Prior Publication Data

US 2002/0167766 A1 Nov. 14, 2002

(30) Foreign Application Priority Data

Sep. 18, 1998 (JP) .......................... 10-264464

(51) Int. Cl.$^7$ .............................. G11B 5/39
(52) U.S. Cl. .................................. 360/324.2
(58) Field of Search ................. 360/324.1, 324.11, 360/324.2, 326, 324.12, 324; 365/158

(56) References Cited

U.S. PATENT DOCUMENTS

| | | | |
|---|---|---|---|
| 4,949,039 A | 8/1990 | Grünberg | 324/252 |
| 5,206,590 A | 4/1993 | Dieny et al. | 324/252 |
| 5,726,837 A * | 3/1998 | Nakatani et al. | 360/324.2 |
| 5,862,022 A * | 1/1999 | Noguchi et al. | 360/324.2 |
| 6,072,382 A * | 6/2000 | Daughton et al. | 338/32 R |
| 6,078,484 A * | 6/2000 | Sakakima | 360/324 |
| 6,084,752 A * | 7/2000 | Sakakima et al. | 360/113 |
| 6,097,579 A * | 8/2000 | Gill | 360/324.2 |
| 6,111,784 A * | 8/2000 | Nishimura | 365/158 |
| 6,118,624 A * | 9/2000 | Fukuzawa et al. | 360/324.12 |
| 6,181,537 B1 * | 1/2001 | Gill | 360/324.2 |
| 6,339,330 B1 * | 1/2002 | Sato et al. | 324/252 |
| 6,381,170 B1 * | 4/2002 | Prinz | 365/171 |
| 6,525,532 B2 * | 2/2003 | Sato et al. | 324/252 |

FOREIGN PATENT DOCUMENTS

| | | |
|---|---|---|
| JP | 4-103014 | 4/1992 |
| JP | 4-358310 | 12/1992 |
| JP | 6-237022 | 8/1994 |
| JP | 2651015 | 5/1997 |
| JP | 9-116209 | 5/1997 |
| JP | 9-251621 | 9/1997 |
| JP | 10-241123 | 1/1998 |
| JP | 10-65232 | 3/1998 |
| JP | 10-124823 | 5/1998 |
| JP | 10-135038 | 5/1998 |

* cited by examiner

Primary Examiner—William Korzuch
Assistant Examiner—Angel Castro
(74) Attorney, Agent, or Firm—Foley & Lardner

(57) ABSTRACT

The present invention provides a magnetoresistive device including a multi-layered structure of a free magnetic layer, a non-magnetic non-conductive layer in contact with the free magnetic layer, a pinned layer in contact with the non-magnetic non-conductive layer, and a pinning layer in contact with the pinned layer for pinning a magnetization direction of the pinned layer, wherein at least any one of the free magnetic layer and the pinned layer has an interface region abutting the non-magnetic non-conductive layer, and at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi.

2 Claims, 9 Drawing Sheets

MAGNETORESISTIVE ELEMENT AND DEVICE UTILIZING MAGNETORESISTANCE EFFECT

BACKGROUND OF THE INVENTION

The present invention relates to a magnetoresistive element, a device utilizing a magnetoresistance effect, and a magnetic sensor utilizing a magnetoresistance effect for reading information signals recorded in a magnetic recording medium, and more particularly to a tunnel junction device having an improved flat non-magnetic layer.

Magnetoresistive sensor and magnetoresistive head have been known as transducers for sensing a magnetic signal and transforming the same into an electrical signal. The magnetoresistive sensor performs to read data from a surface of a magnetic medium at a large linear density. The magnetoresistive sensor has a magnetoresistive element utilizing a magnetoresistance effect for sensing an intensity and a direction of a magnetic flux and transforming variations in intensity and direction of the magnetic flux into a variation in electrical resistance, so as to detect magnetic field signals, wherein one component or one directional component of the resistance varies in proportional to a square of a cosine of an angle defined between a magnetization direction of the magnetoresistive element and a direction along which a sensing current flows through the magnetoresistive element. This effect of such the variations in resistance of the magnetoresistive element is so called as an anisotropic magnetoresistance effect.

More detailed descriptions for the anisotropic magnetoresistance effect are described in IEEE Trans. On Mag. MAG-11, P. 1039 (1975) entitled "memory, storage, and related applications". In general, the transducer, for example, the magnetic head utilizing the anisotropic magnetoresistance effect is applied with a longitudinal bias for suppressing Barkhausen noises. In order to apply the longitudinal bias, anti-ferromagnetic materials such as FeMn, NiMn and nickel oxide are used.

Recently, it also has been known that the variation in resistance of a lamination-structured magnetic sensor causes a more remarkable magnetic resistance effect. This magnetoresistance effect is derived from a spin-dependent transmission of conductive electrons between magnetic layers sandwiching a non-magnetic layer and a spin-dependent scattering which incidentally appears to the spin-dependent transmission on an interface of the lamination-structured magnetic sensor.

Those magnetoresistance effects are different from the anisotropic magnetoresistance effects and are so called as "giant magnetoresistance effect" or "spin valve effect". The magnetoresistive element utilizing the giant magnetoresistance effect or spin valve effect derived from the spin-dependent scattering and the spin-dependent transmission shows a larger variation in resistance than and is more improved in sensitivity than the above described sensor utilizing the anisotropic magnetoresistance effect. The magnetoresistive sensor utilizing the giant magnetoresistance effect or spin valve effect shows a variation in sheet resistance or in-plane resistance between paired ferromagnetic layers sandwiching a non-magnetic layer, wherein the variation is proportional to a cosine of an angle between two magnetization directions of the paired ferromagnetic layers.

In Japanese laid-open patent publication No. 2-61572, it is disclosed that a magnetic layered structure exhibits a large variation in magnetoresistance caused by an anti-parallel order of magnetization in the magnetic layer. It is also disclosed that ferromagnetic transition metals and ferromagnetic alloys are available for the above layered structure. It is further disclosed that one of the two ferromagnetic layers sandwiching the non-magnetic layer is added with a pinned layers and FeMn is available for the pinned layer.

In Japanese laid-open patent publication No. 4-358310, it is disclosed that a magnetoresistive sensor has two ferromagnetic thin layers separated by a non-magnetic metal thin layer, wherein under no application of a magnetic field, individual magnetization directions of the two ferromagnetic layers are perpendicular to each other. A resistance between the separated two ferromagnetic layers varies in proportional to a cosine of an angle defined between the individual magnetization directions of the two ferromagnetic layers, but independently form a direction of a current flowing through the sensor.

In Japanese laid-open patent publication No 4-103014, it is disclosed that a ferromagnetic tunnel junction device has a multi-layered ferromagnetic structure having an inserted intermediate layer. This ferromagnetic tunnel junction device is characterized in that at least one of ferromagnetic layers is applied with a bias, magnetic field from an anti-ferromagnetic layer.

In Japan applied magnetic conference 1996, p. 135, it is disclosed that the tunnel junction device has a free magnetic layer of Co and a pinned magnetic layer NiFe.

In Japanese laid-open patent publication No. 10-65232, it is disclosed that one or two of Ni, Pd, Hf are added to Co-based magnetic alloy for ferromagnetic layers.

In Japanese laid-open patent publication No. 10-135038, it is disclosed that CoZrNb, CoZrMo, FeCoNb are available for the free magnetic layer.

In order to realize a stable property of variation in magnetoresistance of the tunnel junction device, it is important that the non-magnetic layer is so flat as possible, because if the non-magnetic layer is not flat, then variation in thickness of the non-magnetic layer causes a leakage of current which causes reduction in rate of variation in resistance. This leakage of current also causes breaking a thinner portion of the non-magnetic layer. This means that the leakage of current deteriorates the withstand voltage characteristic of the tunnel junction device.

The conventional tunnel junction device uses Co or NiFe for the free magnetic layer and the pinned magnetic layer. However, those materials are crystal, for which reason a most surface of each of the free magnetic layer and the pinned magnetic layer has a roughness which corresponds to the crystal structure. If, for example, the tunnel junction device has a multi-layer structure of "free magnetic layer/non-magnetic non-conductive layer/pinned magnetic layer/pinning layer" and if the free magnetic layer is made of the above material, an interface roughness between the free magnetic layer and the non-magnetic layer makes it difficult to form a sufficiently flat non-magnetic layer, thereby causing drops in rate of the variation in resistance and also the withstand voltage characteristic. Also if the tunnel junction device has a multi-layer structure of "pinning layer/pinned magnetic layer/non-magnetic non-conductive layer/free magnetic layer" and if the pinned magnetic layer is made of the above material, an interface roughness between the free magnetic layer and the non-magnetic layer makes it difficult to form a sufficiently flat non-magnetic layer, thereby causing drops in rate of the variation in resistance and also the withstand voltage characteristic.

In the above circumstances, it had been required to develop a novel magnetoresistive element free from the above problem.

SUMMARY OF THE INVENTION

Accordingly, it is an object of the present invention to provide a novel magnetoresistive element free from the above problems.

It is a further object of the present invention to provide a novel magnetoresistive element having a highly flat non-magnetic layer.

It is a still further object of the present invention to provide a novel magnetoresistive element exhibiting a high rate of variation in resistance.

It is yet a further object of the present invention to provide a novel magnetoresistive element having an improved withstand voltage characteristic.

The third present invention provides a magnetoresistive device including a multi-layered structure of a free magnetic layer, a non-magnetic non-conductive layer in contact with the free magnetic layer, a pinned layer in contact with the non-magnetic non-conductive layer, and a pinning layer in contact with the pinned layer for pinning a magnetization direction of the pinned layer, wherein at least any one of the free magnetic layer and the pinned layer has an interface region abutting the non-magnetic non-conductive layer, and at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi. Those materials are amorphous or fine crystal with fine crystal grains, for which reason the non-magnetic non-conductive layer is highly uniform in thickness and extremely small in surface roughness. The non-magnetic non-conductive layer is also highly flat and extremely small in surface roughness, whereby a magnetoresistance rate is improved high and a withstand voltage characteristic is also improved.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
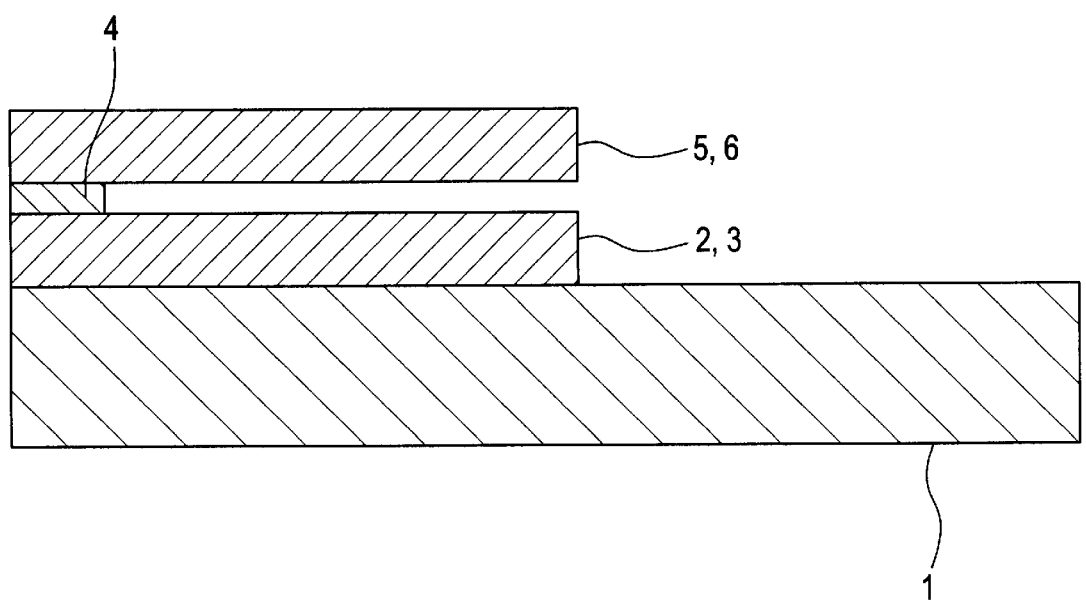
FIG. 1 is a cross sectional elevation view illustrative of a structure of a shield magnetoresistive device in a first embodiment in accordance with the present invention.

The first present invention provides an interface region of a magnetic layer to a non-magnetic non-conductive layer, wherein at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi. Those materials are amorphous or fine crystal with fine crystal grains, for which reason the non-magnetic non-conductive layer is highly uniform in thickness and extremely small in surface roughness. The non-magnetic non-conductive layer is also highly flat and extremely small in surface roughness, whereby a magnetoresistance rate is improved high and a withstand voltage characteristic is also improved.

It is preferable that entire parts of the interface region is made of the at least one material.

It is also preferable that the magnetic layer is a free magnetic layer of a magnetoresistive device.

It is also preferable that the magnetic layer is a pinned magnetic layer of a magnetoresistive device.

The second present invention also provides a magnetoresistive device having at least an interface region of the above first present invention.

The third present invention provides a magnetoresistive device including a multi-layered structure of a free magnetic layer, a non-magnetic non-conductive layer in contact with the free magnetic layer, a pinned layer in contact with the non-magnetic non-conductive layer, and a pinning layer in contact with the pinned layer for pinning a magnetization direction of the pinned layer, wherein at least any one of the free magnetic layer and the pinned layer has an interface region abutting the non-magnetic non-conductive layer, and at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi. Those materials are amorphous or fine crystal with fine crystal grains, for which reason the non-magnetic non-conductive layer is highly uniform in thickness and extremely small in surface roughness. The non-magnetic non-conductive layer is also highly flat and extremely small in surface toughness, whereby a magnetoresistance rate is improved high and a withstand voltage characteristic is also improved.

It is preferable that both the free magnetic layer and the pinned layer have individual interface regions abutting the non-magnetic non-conductive layer, and entire parts of each of the have individual interface regions are made of the at least one amorphous material.

The fourth present invention provides a magnetoresistive sensor including a magnetoresistive device in accordance with the third present invention.

The fifth present invention provides a yoke magnetoresistive transducer having a magnetoresistive device and a yoke isolated by an insulation layer from the magnetoresistive device, wherein the magnetoresistive device is in accordance with the third present invention. The magnetoresistive device including a multi-layered structure of a free magnetic layer, a non-magnetic non-conductive layer in contact with the free magnetic layer, a pinned layer in contact with the non-magnetic non-conductive layers and a pinning layer in contact with the pinned layer for pinning a magnetization direction of the pinned layer, wherein at least any one of the free magnetic layer and the pinned layer has an interface region abutting the non-magnetic non-conductive layer, and at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi. Those materials are amorphous or fine crystal with fine crystal grains, for which reason the non-magnetic non-conductive layer is highly uniform in thickness and extremely small in surface roughness. The non-magnetic non-conductive layer is also highly flat and extremely small in surface roughness, whereby a magnetoresistance rate is improved high and a withstand voltage characteristic is also improved.

The sixth present invention provides a flux guide magnetoresistive transducer having a magnetoresistive device and a yoke isolated by an insulation layer from the magnetoresistive devices wherein the magnetoresistive device is in accordance with the third present invention. The magnetoresistive device including a multi-layered structure of a free magnetic layer, a non-magnetic non-conductive layer in contact with the free magnetic layer, a pinned layer in contact with the non-magnetic non-conductive layer, and a pinning layer in contact with the pinned layer for pinning a magnetization direction of the pinned layer, wherein at least any one of the free magnetic layer and the pinned layer has an interface region abutting the non-magnetic non-conductive layer, and at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi. Those materials are amorphous or fine crystal with fine crystal grains, for which reason the non-magnetic non-conductive layer is highly uniform in thickness and extremely small in surface roughness. The non-magnetic non-conductive layer is also highly flat and extremely small in surface roughness, whereby a magnetoresistance rate is improved high and a withstand voltage characteristic is also improved.

The seventh present invention provides a magnetoresistance detecting device comprising: a sensor utilizing a magnetoresistive device; and a detecting means being connected to the sensor for detecting variation in resistivity of the sensor as a function of a magnetic field as detected by the sensor, wherein the magnetoresistive device is in accordance with the third present invention. The magnetoresistive device including a multi-layered structure of a free magnetic layer, a non-magnetic non-conductive layer in contact with the free magnetic layer, a pinned layer in contact with the non-magnetic non-conductive layer, and a pinning layer in contact with the pinned layer for pinning a magnetization direction of the pinned layer, wherein at least any one of the free magnetic layer and the pinned layer has an interface region abutting the non-magnetic non-conductive layer, and at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd. CoTaZrNb, and CoZrMoNi. Those materials are amorphous or fine crystal with fine crystal grains, for which reason the nonmagnetic non-conductive layer is highly uniform in thickness and extremely small in surface roughness. The non-magnetic non-conductive layer is also highly flat and extremely small in surface roughness, whereby a magnetoresistance rate is improved high and a withstand voltage characteristic is also improved.

The eighth present invention provides a magnetic recording system comprising: a magnetic recording medium having a plurality of tracks for data recording; a data recording device for recording data into the magnetic recording; a magnetoresistance detecting device for detecting magnetoresistance; and an actuator for actuating both the data recording device and the magnetoresistance detecting device over the magnetic recording medium, wherein the magnetoresistance detecting device is in accordance with the seventh present invention. The magnetoresistive device including a multi-layered structure of a free magnetic layer, a non-magnetic non-conductive layer in contact with the free magnetic layer, a pinned layer in contact with the non-magnetic non-conductive layer, and a pinning layer in contact with the pinned layer for pinning a magnetization direction of the pinned layer, wherein at least any one of the free magnetic layer and the pinned layer has an interface region abutting the non-magnetic non-conductive layer, and at least a part of the interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi. Those materials are amorphous or fine crystal with fine crystal grains, for which reason the non-magnetic non-conductive layer is highly uniform in thickness and extremely small in surface roughness. The non-magnetic non-conductive layer is also highly flat and extremely small in surface roughness, whereby a magnetoresistance rate is improved high and a withstand voltage characteristic is also improved.

PREFERRED EMBODIMENT

A first embodiment according to the present invention will be described in detail with reference to the drawings. A shield magnetoresistive device is provided. FIG. 1 is a cross sectional elevation view illustrative of a structure of a shield magnetoresistive device in a first embodiment in accordance with the present invention.

Over a substrate 1, a bottom structure is provided which includes a bottom shield layer 2 and a bottom electrode 3. A magnetoresistive device 4 is provided on the bottom structure. The magnetoresistive device 4 is patterned by a photoresist process so that the magnetoresistive device 4 has a predetermined shape and a predetermined size. A top structure is further provided on the magnetoresistive device 4, so that the bottom and top structures sandwich the magnetoresistive device 4, wherein the top structure includes a top shield layer 5 and a top electrode 6.

Figure 4:
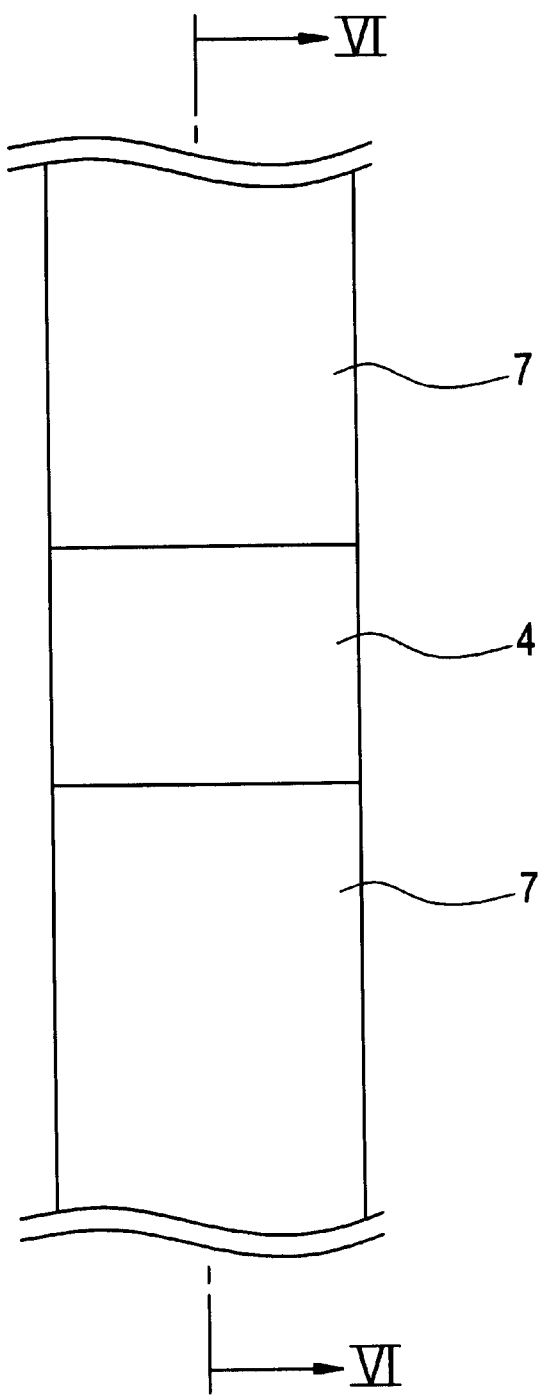
FIG. 4 is a fragmentary cross sectional elevation view illustrative of a magnetoresistive device and longitudinal bias layers in contact with an edge of the magnetoresistive device in a first embodiment of the present invention.
Figure 5:
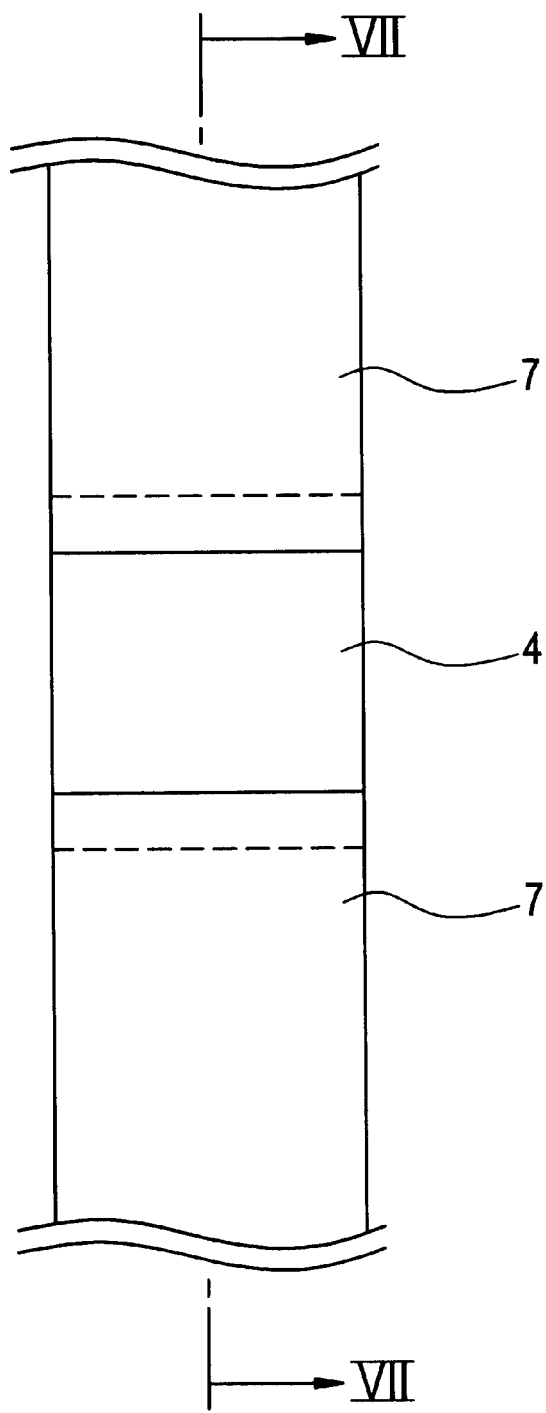
FIG. 5 is a fragmentary cross sectional elevation view illustrative of a magnetoresistive device and longitudinal bias layers in contact with a part of the edge of the magnetoresistive device in a first embodiment of the present invention.

FIG. 4 is a fragmentary cross sectional elevation view illustrative of a magnetoresistive device and longitudinal bias layers in contact with an edge of the magnetoresistive device in a first embodiment of the present invention. As shown in FIG. 4, longitudinal bias layers 7 are provided which are in contact directly with an edge of the magnetoresistive device 4. FIG. 5 is a fragmentary cross sectional elevation view illustrative of a magnetoresistive device and longitudinal bias layers in contact with a part of the edge of the magnetoresistive device in a first embodiment of the present invention. Alternatively, as shown in FIG. 5, longitudinal bias layers 7 are provided which are in contact directly with a part of the edge of the magnetoresistive device 4.

The bottom structure described above may be as follows.

Figure 2A:
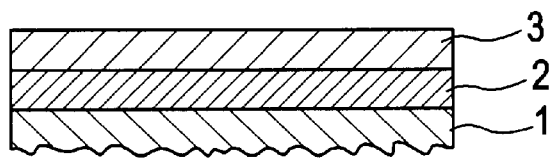
FIG. 2A is a fragmentary cross sectional elevation view illustrative of a first example of the bottom structure of the shield magnetoresistive device of FIG. 1.

FIG. 2A is a fragmentary cross sectional elevation view illustrative of a first example of the bottom structure of the shield magnetoresistive device of FIG. 1. The bottom shield layer 2 is laminated on the top surface of the substrate 1. The bottom electrode 3 is laminated on the bottom shield layer 2.

Figure 2B:
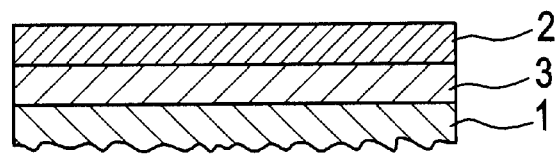
FIG. 2B is a fragmentary cross sectional elevation view illustrative of a second example of the bottom structure of the shield magnetoresistive device of FIG. 1.

FIG. 2B is a fragmentary cross sectional elevation view illustrative of a second example of the bottom structure of the shield magnetoresistive device of FIG. 1. The bottom electrode 3 is laminated on the top surface of the substrate 1. The bottom shield layer 2 is laminated on the bottom electrode 3.

Figure 2C:
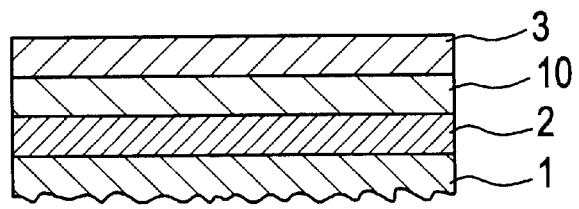
FIG. 2C is a fragmentary cross sectional elevation view illustrative of a third example of the bottom structure of the shield magnetoresistive device of FIG. 1.

FIG. 2C is a fragmentary cross sectional elevation view illustrative of a third example of the bottom structure of the shield magnetoresistive device of FIG. 1. The bottom shield layer 2 is laminated on the top surface of the substrate 1. A bottom gap insulation layer 10 is laminated on the bottom shield layer 2 The bottom electrode 3 is laminated on the bottom gap insulation layer 10.

Figure 2D:
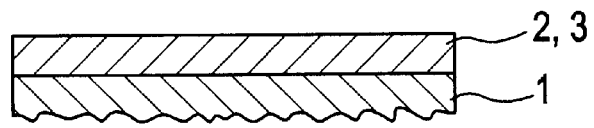
FIG. 2D is a fragmentary cross sectional elevation view illustrative of a fourth example of the bottom structure of the shield magnetoresistive device of FIG. 1.

FIG. 2D is a fragmentary cross sectional elevation view illustrative of a fourth example of the bottom structure of the shield magnetoresistive device of FIG. 1. The bottom shield layer 2 and the bottom electrode 3 are formed in a single common layer The top structure described above may be as follows.

Figure 3A:
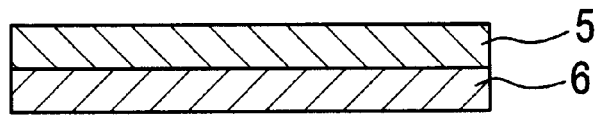
FIG. 3A is a fragmentary cross sectional elevation view illustrative of a first example of the top structure of the shield magnetoresistive device of FIG. 1.

FIG. 3A is a fragmentary cross sectional elevation view illustrative of a first example of the top structure of the shield magnetoresistive device of FIG. 1. The top shield layer 5 is laminated on the top surface of the magnetoresistive device 4. The top electrode 6 is laminated on the top shield layer 5.

Figure 3B:
FIG. 3B is a fragmentary cross sectional elevation view illustrative of a second example of the top structure of the shield magnetoresistive device of FIG. 1.

FIG. 3B is a fragmentary cross sectional elevation view illustrative of a second example of the top structure of the shield magnetoresistive device of FIG. 1. The top electrode 6 is laminated on the top surface of the magnetoresistive device 4. The top shield layer 5 is laminated on the top electrode 6.

Figure 3C:
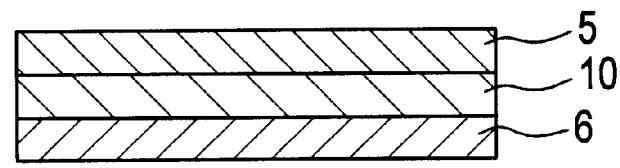
FIG. 3C is a fragmentary cross sectional elevation view illustrative of a third example of the top structure of the shield magnetoresistive device of FIG. 1.

FIG. 3C is a fragmentary cross sectional elevation view illustrative of a third example of the top structure of the shield magnetoresistive device of FIG. 1. The top shield layer 5 is laminated on the top surface of the magnetoresistive device 4. A top gap insulation layer 10 is laminated on the top shield layer 5. The top electrode 6 is laminated on the top gap insulation layer 10.

Figure 3D:
FIG. 3D is a fragmentary cross sectional elevation view illustrative of a fourth example of the top structure of the shield magnetoresistive device of FIG. 1.

FIG. 3D is a fragmentary cross sectional elevation view illustrative of a fourth example of the top structure of the shield magnetoresistive device of FIG. 1. The top shield layer 5 and the top electrode 6 are formed in a single common layer.

As described above and as shown in FIG. 4, longitudinal bias layers 7 are provided which are in contact directly with an edge of the magnetoresistive device 4. Alternatively, as shown in FIG. 5, longitudinal bias layers 7 are provided which are in contact directly with a part of the edge of the magnetoresistive device 4.

Figure 6:
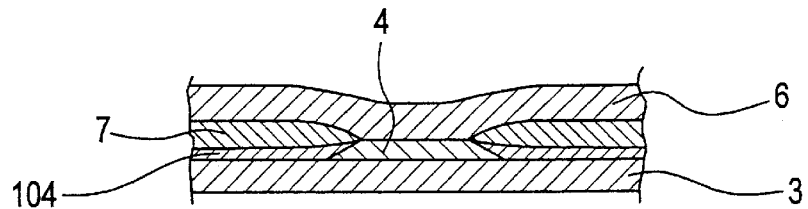
FIG. 6 is a fragmentary cross sectional elevation view taken along a VI—VI line of FIG. 4.

FIG. 6 is a fragmentary cross sectional elevation view taken along a VI—VI line of FIG. 4. A ferromagnetic tunnel junction layer serving as the magnetoresistive device 4 is selectively formed on a predetermined region of a top surface of the bottom electrode 3. Insulation layers 104 are formed on other regions of the top surface of the bottom electrode 3, so that the isolation layers 104 are in contact with sloped side faces of the ferromagnetic tunnel junction layer. Longitudinal bias layers 7 are also provided over the insulation layers 104 so that edges of the longitudinal bias layers 7 are in contact with edges of the ferromagnetic tunnel junction layer. The insulation layers 104 confines a sense current into the ferromagnetic tunnel junction layer serving as the magnetoresistive device 4 and prevents the sense current from flowing through the longitudinal bias layers 7. If the longitudinal bias layers 7 are made of a highly insulative material such as a non-metal, it is possible to provide the longitudinal bias layers 7 on the other regions of the bottom electrode 3 without providing the insulation layers 104. A top electrode 6 is provided which extends over the longitudinal bias layer 7 and a top surface of the ferromagnetic tunnel junction layer serving as the magnetoresistive device 4.

Figure 7:
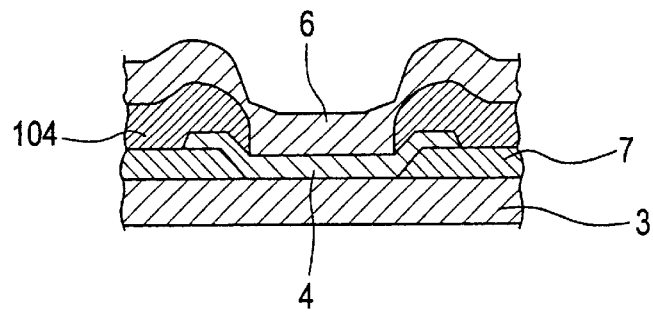
FIG. 7 is a fragmentary cross sectional elevation view taken along a VII—VII line of FIG. 5.

FIG. 7 is a fragmentary cross sectional elevation view taken along a VII—VII line of FIG. 5. Longitudinal bias layers 7 are selectively provided on other regions than a predetermined region of a top surface of a bottom electrode 3. A ferromagnetic tunnel junction layer serving as the magnetoresistive device 4 is selectively formed which extends on the predetermined region of the top surface of the bottom electrode 3 and also extends on inside parts of the longitudinal bias layers 7. Insulation layers 104 are formed on the longitudinal bias layers 7 and outside regions of the ferromagnetic tunnel junction layer serving as the magnetoresistive device 4, so that inside edges of the insulation layers 104 correspond in plane view to the inside edges of the ferromagnetic tunnel junction layer serving as the magnetoresistive device 4. The insulation layers 104 confine a sense current into a functional part of the ferromagnetic tunnel junction layer serving as the magnetoresistive device 4, where the functional part of the ferromagnetic tunnel junction layer is in contact directly with the bottom electrode 3. The insulation layers 104 also prevent the sense current from flowing through the longitudinal bias layers 7. A top electrode 6 is provided which extends over the insulation layer 104 and a top surface of the ferromagnetic tunnel junction layer serving as the magnetoresistive device 4. As the bottom shield layer 2 in FIG. 1, there are available NiFe, CoZr, CoFeB alloy, CoZrMo alloy, CoZrNb alloy, CoZr alloy, CoZiTa alloy, CoHf alloy, CoTa alloy, CoTaHf alloy, CoNbHf alloy, CoZrNb alloy, CoHfPd alloy, CoTaZrNb alloy, CoZrMoNi alloy, FeAlSi, and iron nitride based materials. An available thickness of the bottom shield layer 2 is 0.3–10 micrometers.

As the top and bottom electrodes 6 and 3, there are available Zr, Ta, Mo, and alloys thereof and mixtures thereof. An available thickness of each of the top and bottom electrodes 6 and 3 is 0.01–0.10 micrometers.

As the longitudinal bias layer 7, there are available CoCrPt, CoCr, CoPt, CoCrTa, FeMn, NiMn, IrMn, PtPdMn, ReMn, PtMn, CrMn, Ni-oxide, iron oxide, a mixture of Ni-oxide Co-oxide, a mixture of Ni-oxide and Fe-oxide, double layers of Ni-oxide/Co-oxide, and double layers of Ni-oxide/Fe-oxide.

As the top shield layer 5, there are available NiFe, CoZr, CoFeB alloy, CoZrMo alloy, CoZrNb alloy, CoZr alloy, CoZrTa alloy, CoHf alloy, CoTa alloy, CoTaHf alloy, CoNbHf alloy, CoZrNb alloy, CoHfPd alloy, CoTaZrNb alloy, CoZrMoNi alloy, FeAlSi, and iron nitride based materials. An available thickness of the bottom shield layer 2 is 0.3–10 micrometers.

Figure 8:
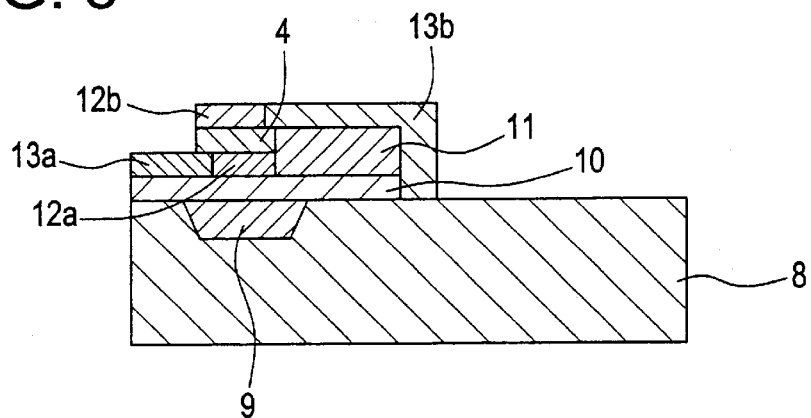
FIG. 8 is a cross sectional elevation view illustrative of a structure of a yoke magnetoresistive device in a second embodiment in accordance with the present invention.

A second embodiment according to the present invention will be described in detail with reference to the drawings. A yoke magnetoresistive device is provided. FIG. 8 is a cross sectional elevation view illustrative of a structure of a yoke magnetoresistive device in a second embodiment in accordance with the present invention.

A ferromagnetic substrate 8 has a groove into which a non-magnetic insulator 9 is filled. As the ferromagnetic substrate 8, there are available NiZn ferrite, MnZn ferrite, and MgZn ferrite. As the non-magnetic insulator 9, there are available alumina, silicon dioxide, aluminum nitride, silicon nitride, diamond like carbon.

A bottom non-magnetic layer 10 is provided on a predetermined region of the top surface of the ferromagnetic substrate 8, so that a bottom surface of the bottom non-magnetic layer 10 is in contact with the top surface of the non-magnetic insulator 9.

A first magnetic pole 13a is provided on a first predetermined region of a top surface of the bottom nonmagnetic layer 10. A bottom electrode 12a is also provided on a second predetermined region of a top surface of the bottom non-magnetic layer 10, so that a side of the bottom electrode 12a is in contact with a side of the first magnetic pole 13a. A top non-magnetic layer 11 is provided on other region than the first and second predetermined regions of the top surface of the bottom non-magnetic layer 10, so that a bottom surface of the top non-magnetic layer 11 is in contact with the other region of the top surface of the bottom non-magnetic layer 10. A magnetoresistive element 4 is provided which extends over the bottom electrode 12a and a part of the first magnetic pole 13a, so that a side of the magnetoresistive element 4 is in contact with a side of the top non-magnetic layer 11.

It is preferable that the bottom electrode 12a is made of Au, whilst as the first magnetic pole 13a, there are available NiFe, CoZr, CoFeB alloy, CoZrMo alloy, CoZrNb alloy, CoZr alloy, CoZrTa alloy, CoHf alloy, CoTa alloy, CoTaHf alloy, CoNbHf alloy, CoZrNb alloy, CoHfPd alloy, CoTaZrNb alloy, CoZrMoNi alloy, FeAlSi, iron nitride based materials, NiZn ferrite, MnZn ferrite, and MgZn ferrite.

Longitudinal bias layers are provided which are not illustrated in FIG. 8, so that the longitudinal bias layers are in contact with side edges of the magnetoresistive device 4, wherein the longitudinal bias layers sandwich the magnetoresistive device 4 in a horizontal direction perpendicular to a direction of the sectioned view. The longitudinal bias layers are provided for controlling magnetic domains of the magnetoresistive device 4. Boundary structure between the magnetoresistive device 4 and the longitudinal bias layers may be either as in FIGS. 4 and 6 or as shown in FIGS. 5 and 7 as described in the first embodiment.

As the longitudinal bias layers, there are available CoCrPt, CoCr, CoPt, CoCrTa, FeMn, NiMn, Ni-oxide, NiCo-oxide IrMn, PtPdMn, and ReMn.

As shown in FIG. 8, a top magnetic pole 13b is provided which extends over a part of the magnetoresistive element 4 and the top non-magnetic layer 11 and also extends on side walls of the top non-magnetic layer 11 and the bottom magnetic layer 10 as well as extends on an adjacent part of the top surface of the ferromagnetic substrate 8, wherein the adjacent part is adjacent to the bottom non-magnetic layer 10. A top electrode 12b is also provided on the magnetoresistive element 4, so that a side edge of the top electrode 12b is in contact with the side edge of the top magnetic polo 13b. As the top electrode 12b, the same materials as the bottom electrode 12a are available. As the top magnetic pole 13b, the same materials as the bottom magnetic pole 13a are also available.

Figure 9:
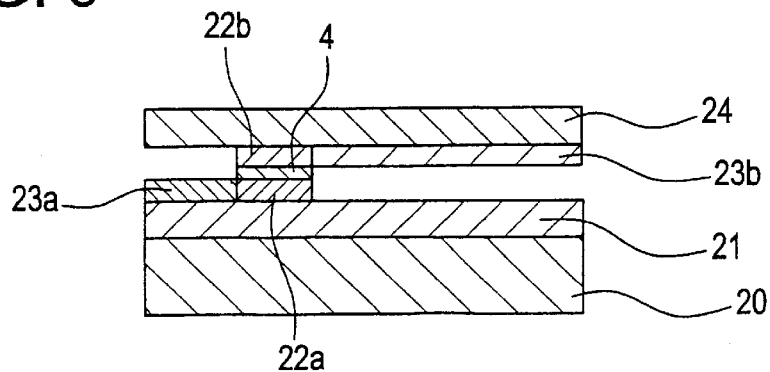
FIG. 9 is a cross sectional elevation view illustrative of a structure of a flux guide magnetoresistive head in a third embodiment in accordance with the present invention.

A third embodiment according to the present invention will be described in detail with reference to the drawings. A flux guide magnetoresistive head is provided. FIG. 9 is a cross sectional elevation view illustrative of a structure of a flux guide magnetoresistive head in a third embodiment in accordance with the present invention.

On a substrate 20, a bottom shield layer 21 is provided. A bottom electrode 22a is provided on a first predetermined region of a top surface of the bottom shield layer 21. A bottom magnetic pole 23a is also provided on a second predetermined region of the top surface of the bottom shield layer 21, so that a side edge of the bottom magnetic pole 23a is in contact with a side edge of the bottom electrode 22a. A magnetoresistive element 4 is provided on a top surface of the bottom electrode 22a. A top electrode 22b is provided on a top surface of the magnetoresistive element 4. A top shield layer 24 is provided over the top electrode 22b so that a part of the top shield layer 24 is in contact with a top surface of the top electrode 22b. A top magnetic pole 23b is provided on a bottom surface of the top shield layer 24, so that a side edge of the top magnetic pole 23b is in contact with a side edge of the top electrode 22b.

As the bottom shield layer 21, there are available NiFe, CoZr, CoFeB alloy, CoZrMo alloy, CoZrNb alloy, CoZr alloy, CoZrTa alloys, CoHf alloy, CoTa alloy, CoTaHf alloy, CoNbHf alloy, CoZrNb alloy, CoHfPd alloy, CoTaZrNb alloy, CoZrMoNi alloy, FeAlSi, iron nitride based materials, NiZn ferrite, MnZn ferrite, and MgZn ferrite.

It is preferable that the bottom electrode 22a is made of Au, whilst as the bottom magnetic pole 23a, there are available NiFe, CoZr, CoFeB alloy, CoZrMo alloy, CoZrNb alloy, CoZr alloy, CoZrTa alloy, CoHf alloy, CoTa alloy, CoTaHf alloy, CoNbHf alloy, CoZrNb alloy, CoHfPd alloy, CoTaZrNb alloy, CoZrMoNi alloy, FeAlSi, iron nitride based materials, NiZn ferrite, MnZn ferrite, and MgZn ferrite.

As the top shield layer 24, there are available NiFe, CoZr, CoFeB alloy, CoZrMo alloy, CoZrNb alloy, CoZr alloy, CoZrTa alloy, CoHf alloy, CoTa alloy, CoTaHf alloy, CoNbHf alloy, CoZrNb alloy, CoHfPd alloy, CoTaZrNb alloy, CoZrMoNi alloy, FeAlSi, iron nitride based materials, NiZn ferrite, MnZn ferrite, and MgZn ferrite.

Longitudinal bias layers are provided which are not illustrated in FIG. 8, so that the longitudinal bias layers are in contact with side edges of the magnetoresistive device 4, wherein the longitudinal bias layers sandwich the magnetoresistive device 4 in a horizontal direction perpendicular to a direction of the sectioned view. The longitudinal bias layers are provided for controlling magnetic domains of the magnetoresistive device 4. Boundary structure between the magnetoresistive device 4 and the longitudinal bias layers may be either as in FIGS. 4 and 6 or as shown in FIGS. 5 and 7 as described in the first embodiment.

As the longitudinal bias layers, there are available CoCrPt, CoCr, CoPt, CoCrTa, FeMn, NiMn, Ni-oxide, NiCo-oxide IrMn, PtPdMn, and ReMn.

Figure 10:
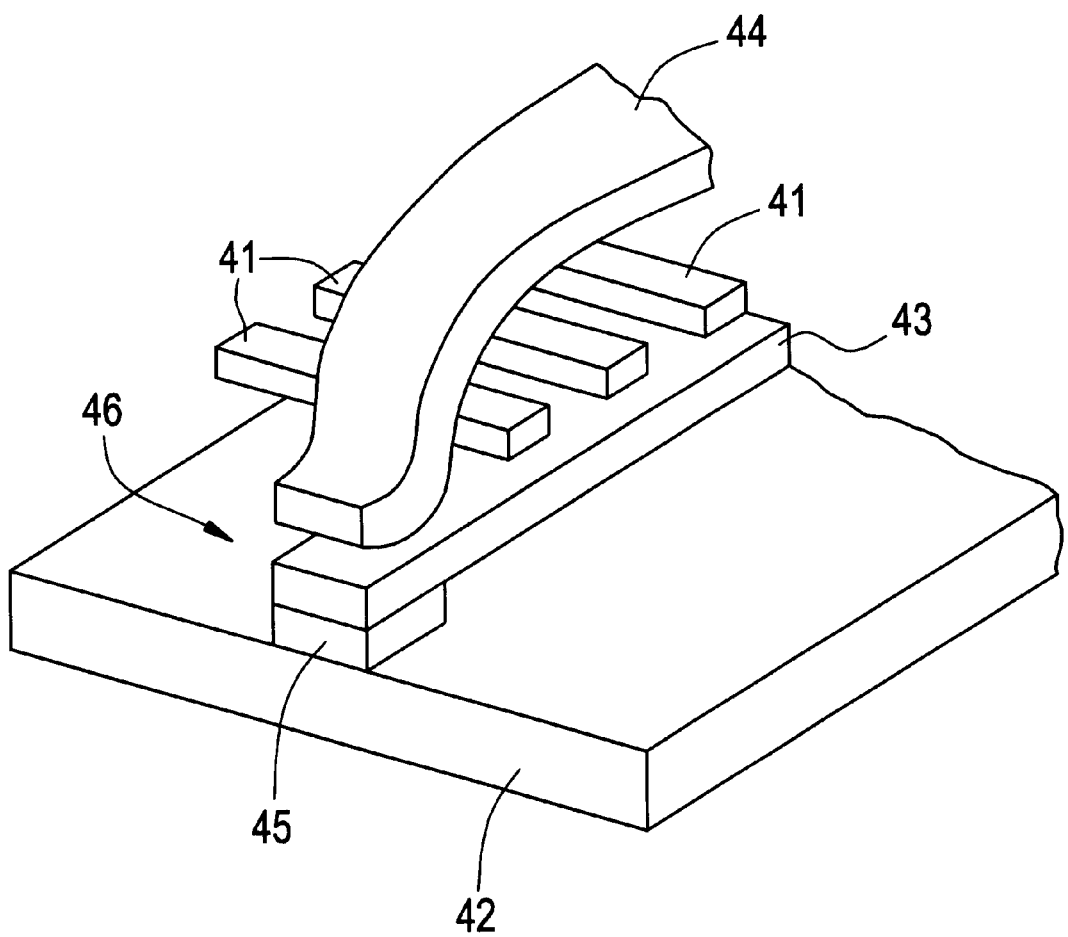
FIG. 10 is a schematic perspective view illustrative of a recording/reproducing head of a fourth embodiment in accordance with the present invention.

A fourth embodiment according to the present invention will be described in detail with reference to the drawings. The above shield magnetoresistive device of the first embodiment, the above yoke magnetoresistive device of the second embodiment and the flux guide magnetoresistive device of the third embodiment may be applied for a transducer or a writing head with an inductive coil. This inductive coil writing head serves as a recording/reproducing head. FIG. 10 is a schematic perspective view illustrative of a recording/reproducing head of a fourth embodiment in accordance with the present invention.

The recording/reproducing head comprises an inductive type recording head and a re-producing head utilizing any one of the above shield magnetoresistive device of the first embodiment, the above yoke magnetoresistive device of the second embodiment and the flux guide magnetoresistive device of the third embodiment. In FIG. 10, the magnetoresistive device is combined with a longitudinal magnetic recording head for a longitudinal recording. Notwithstanding, it is also possible that the magnetoresistive device is combined with a perpendicular magnetic recording head for a perpendicular recording. In FIG. 10, the shield magnetoresistive device of the first embodiment is taken as an example. The above yoke magnetoresistive device of the second embodiment and the flux guide magnetoresistive device of the third embodiment are, however, applicable.

In FIG. 10, a bottom shield/bottom electrode 42 is provided over a substrate not illustrated. A magnetoresistive device 45 is provided on a predetermined region of a top surface of the bottom shield/bottom electrode 42. A top shield/top electrode 43 is provided on the magnetoresistive device 45 and over the bottom shield/bottom electrode 42, wherein a part of a bottom surface of the top shield/top electrode 43 is in contact with a top surface of the magnetoresistive device 45, but the top shield/top electrode 43 is spaced from the top surface of the bottom shield/bottom electrode 42. The magnetoresistive device 45 and the top shield/top electrode 43 forms the reproducing head.

The above top shield/top electrode 43 also serves as a bottom magnetic pole. Coils 41 are provided over the top shield/top electrode 43 serving as the bottom magnetic pole. A top magnetic pole 44 is provided over the coils 44, so that the coils 44 are positioned between the top and bottom magnetic poles 43 and 44. The top and bottom magnetic poles 44 and 43 and the coils 41 form the recording head.

It is also possible that the top shield layer and the bottom magnetic layer are commonly formed to be a single layer or are separately formed two layers.

The above head performs to write signals or data onto the recording medium and also read out signals or data from the recording medium. A sensing portion of the reproducing head and a magnetic gap of the recording head are superimposed over the same slider so that a concurrent positioning at the same track of the recording medium is possible. This head is formed to be a slider for mounding a magnetic recording reproducing apparatus.

Figure 11:
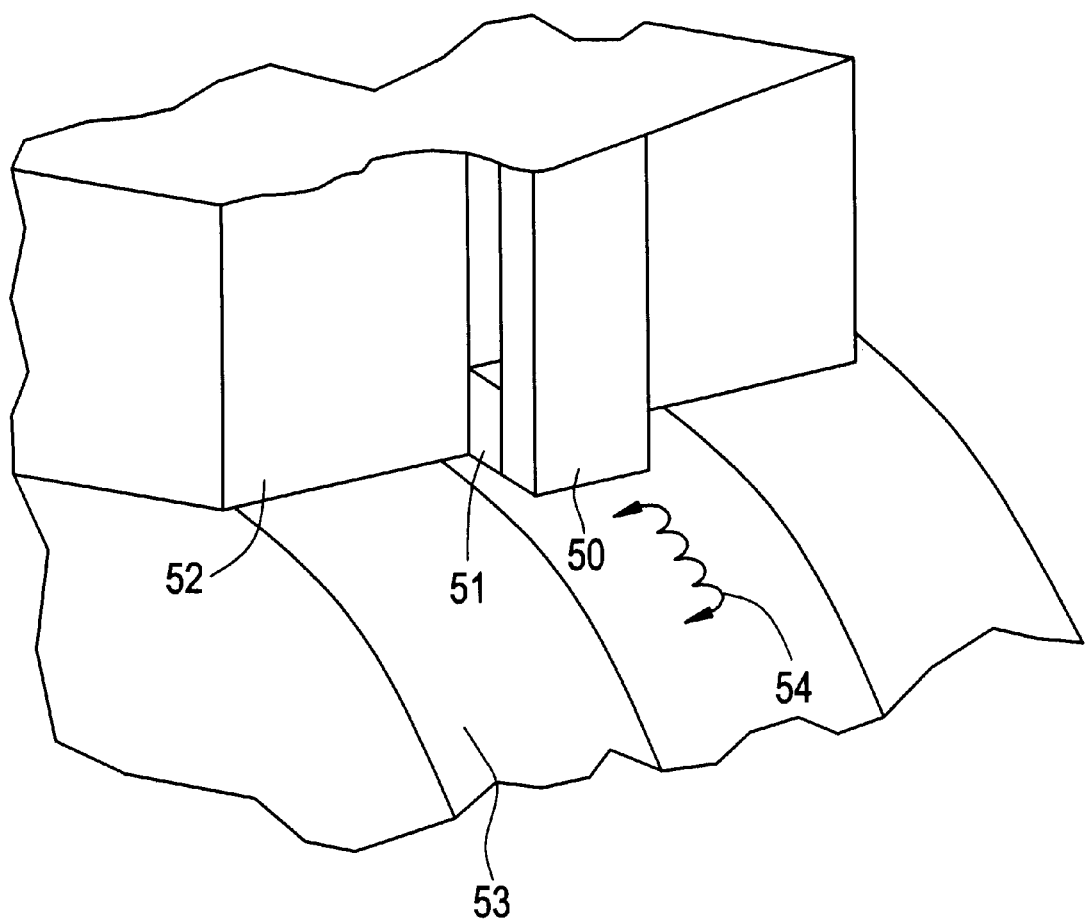
FIG. 11 is a schematic perspective view illustrative of a magnetic recording reproducing device using a magnetoresistive device in a fifth embodiment in accordance with the present invention.

A fifth embodiment in accordance with the present invention will be described with reference to the drawings. FIG. 11 is a schematic perspective view illustrative of a magnetic recording reproducing device using a magnetoresistive device in a fifth embodiment in accordance with the present invention. A substrate not illustrated serves as a head slider. A bottom shield/bottom electrode 52 is provided on the substrate. A magnetoresistive device 51 is also provided on the bottom shield/bottom electrode 52. A top shield/top electrode 50 is provided on the magnetoresistive device 51.

This head is positioned over a recording medium 53 for re-producing. The recording medium 53 rotates and the head slider shows a relative motion to the recording medium 53 with a gap of 0.2 micrometers or in contact therewith. The magnetoresistive device 51 is so positioned as capable of sensing an intensity of a leaked magnetic field 54 for reading out magnetic signals from the recording medium.

A sixth embodiment in accordance with the present invention will be described in detail. The above described magnetoresistive device may comprise the following eight multi-layer structures.

A first available multi-layered structure for the magnetoresistive device is as follows. A base layer is provided on a substrate. A free magnetic layer is provided on the base layer. A non-magnetic non-conductive layer is provided on the free magnetic layer. A pinned layer is provided on the non-magnetic non-conductive layer. A pinning layer is provided on the pinned layer for pinning a magnetization direction of the pinned layer. A passivation layer is provided on the pinning layer.

A second available multi-layered structure for the magnetoresistive device is as follows. A base layer is provided on a substrate. A free magnetic layer is provided on the base layer. A first magnetoresistive enhanced layer is provided on the free magnetic layer. A non-magnetic non-conductive layer is provided on the first magnetoresistive enhanced layer. A pinned layer is provided on the non-magnetic non-conductive layer. A pinning layer is provided on the pinned layer for pinning a magnetization direction of the pinned layer. A passivation layer is provided on the pinning layer.

A third available multi-layered structure for the magnetoresistive device is as follows. A base layer is provided on a substrate. A free magnetic layer is provided on the base layer. A non-magnetic non-conductive layer is provided on the free magnetic layer. A second magnetoresistive enhanced layer is provided on the non-magnetic non-conductive layer. A pinned layer is provided on the second magnetoresistive enhanced layer. A pinning layer is provided on the pinned layer for pinning a magnetization direction of the pinned layer. A passivation layer is provided on the pinning layer.

A fourth available multi-layered structure for the magnetoresistive device is as follows. A base layer is provided on a substrate. A free magnetic layer is provided on the base layer. A first magnetoresistive enhanced layer is provided on the free magnetic layer. A non-magnetic non-conductive layer is provided on the first magnetoresistive enhanced layer. A second magnetoresistive enhanced layer is provided on the non-magnetic non-conductive layer. A pinned layer is provided on the second magnetoresistive enhanced layer. A pinning layer is provided on the pinned layer for pining a magnetization direction of the pinned layer. A passivation layer is provided on the pinning layer.

A fifth available multi-layered structure for the magnetoresistive device is as follows. A base layer is provided on a substrate. A pinning layer is provided on the base layer for pinning a magnetization direction of a pinned layer which is provided on the pinning layer. The pinned layer is thus provided on the pinning layer so that the magnetization direction of the pinned layer is pinned by the pinning layer. A nonmagnetic non-conductive layer is provided on the pinned layer. A free magnetic layer is provided on the non-magnetic non-conductive layer. A passivation layer is provided on the free magnetic layer.

A sixth available multi-layered structure for the magnetoresistive device is as follows. A base layer is provided on a substrate. A pinning layer is provided on the base layer for pinning a magnetization direction of a pinned layer which is provided on the pinning layer. The pinned layer is thus provided on the pinning layer so that the magnetization direction of the pinned layer is pinned by the pinning layer. A first magnetoresistive enhanced layer is provided on the pinned layer A nonmagnetic non-conductive layer is provided on the first magnetoresistive enhanced layer. A free magnetic layer is provided on the non-magnetic non-conductive layer. A passivation layer is provided on the free magnetic layer.

A seventh available multi-layered structure for the magnetoresistive device is as follows. A base layer is provided on a substrate. A pinning layer is provided on the base layer for pinning a magnetization direction of a pinned layer which is provided on the pinning layer. The pinned layer is thus provided on the pinning layer so that the magnetization direction of the pinned layer is pinned by the pinning layer. A nonmagnetic non-conductive layer is provided on the pinned layer. A second magnetoresistive enhanced layer is provided on the nonmagnetic non-conductive layer. A free magnetic layer is provided on the second magnetoresistive enhanced layer. A passivation layer is provided on the free magnetic layer.

Figure 12:
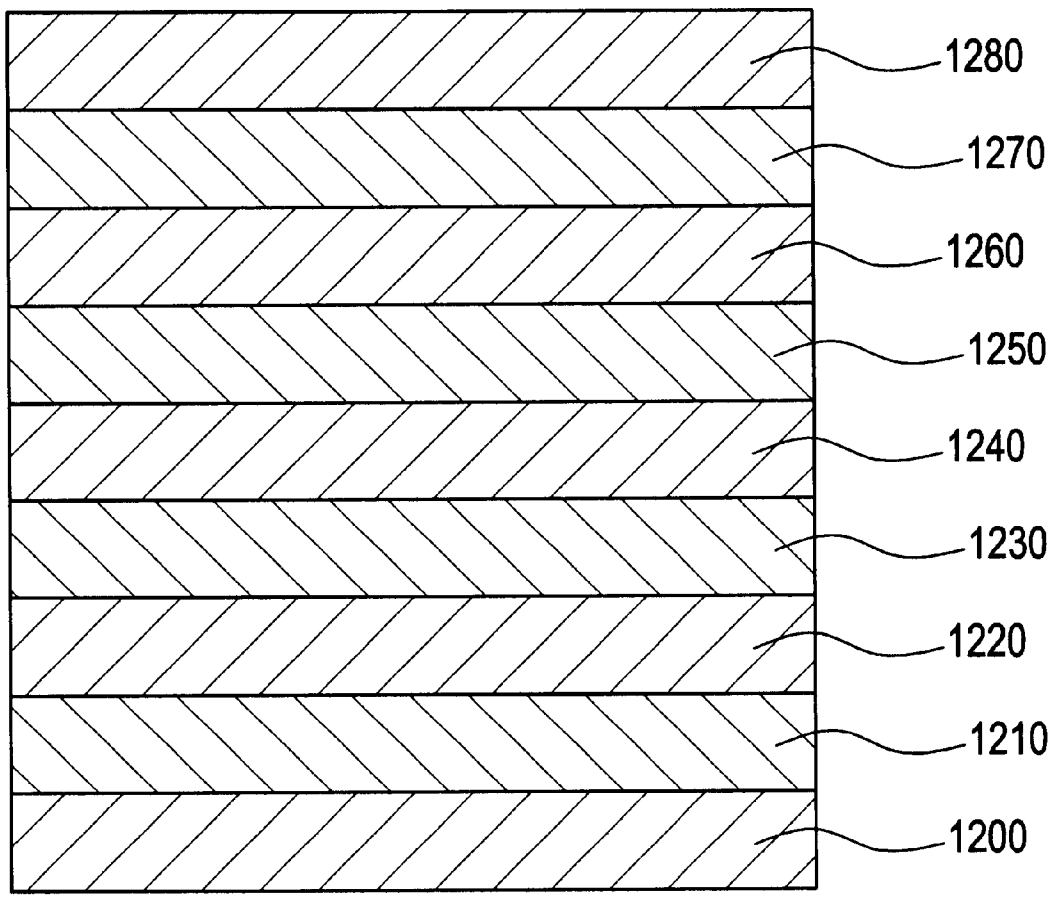
FIG. 12 is a cross sectional elevation view illustrative of a structure of an available multi-layered structure for a magnetroresistive device in a sixth embodiment in accordance with the present invention.

An eighth available multi-layered structure for the magnetoresistive device is as follows, with reference to FIG. 12. A base layer 1210 is provided on a substrate 1200. A pinning layer 1220 is provided on the base layer 1210 for pinning a magnetization direction of a pinned layer 1230 which is provided on the pinning layer 1220. The pinned layer 1230 is thus provided on the pinning layer 1220 so that the magnetization direction of the pinned layer 1230 is pinned by the pinning layer 1220. A first magnetoresistive enhanced layer 1240 is provided on the pinned layer 1230. A nonmagnetic non-conductive layer 1250 is provided on the first magnetoresistive enhanced layer 1240. A second magnetoresistive enhanced layer 1260 is provided on the nonmagnetic non-conductive layer 1250. A free magnetic layer 1270 is provided on the second magnetoresistive enhanced layer 1260. A passivation layer 1280 is provided on the free magnetic layer 1270.

As the base layer, there are available Zr and Zr added with one of materials of Ta, Hf, Zr, W, Cr, Ti, Mo, Pt, Ni, Ir, Cu, Ag, Co, Zn, Ru, Rh, Rc, Au, Os, Pd, Nb, and V. As the free magnetic layer, there are available NiFo alloy, CoFe alloy, NiFeCo alloy, FeCo alloy, CoFeB alloy, CoZrMo alloy, CoZrNb alloy, CoZr alloy, CoZrTa alloy, CoHf alloy, CoTa alloy, CoTaHf alloy, CoNbHf alloy, CoZrNb alloy, CoHfPd alloy, CoTaZrNb alloy, CoZrMoNi alloy, or amorphous magnetic materials thereof.

As the non-magnetic layer, there are available metals, oxides, nitrides, mixtures of oxides and nitrides, double layers of metal/oxide, double layers of metal/nitride, and double layers of metal/oxide-nitride mixture. For those double layers, there are available Ti, V, Cr, Co, Cu, Zn, Y, Zr, Y, Zr, Nb, Mo, Tc, Ru, Rh, Pd, Ag, Hf, Ta, W, Re, Os, Ir, Pt, Au, oxide of one of Si, Al, Ti, and Ta, nitride of one of Si, Al, Ti, and Ta, and mixtures of those oxides and nitrides, and also Ta, Hf, Zr, W, Cr, Ti, Mo, Pt, Ni, Ir, Cu, Ag, Co, Zn, Ru, Rh, Re, Au, Os, Pd, Nb, V, Y and alloys thereof.

As the first and second magnetoresistive enhanced layers. Co, NiFeCo, FeCo, CoFeB alloy, CoZrMo alloy, CoZrNb alloy, CoZr alloy, CoZrTa alloy, CoHf alloy, CoTa alloy, CoTaHf alloy, CoNbHf alloy, CoZrNb alloy, CoHfPd alloy, CoTaZrNb alloy, CoZrMoNi alloy or amorphous thereof.

If no magnetoresistive enhanced layer is used, then the magnetoresistance rate is slightly reduced but the number of fabrication processes is decreased, As the pinned magnetic layer, there are available Co-based materials, Ni-based materials and Fe-based materials and alloys thereof and multi-layers of those materials.

As the pinning layer for pinning the magnetization direction of the pinned layer, there are available FeMn, NiMn, IrMn, RhMn, PtPdMn, ReMn, PtMn, PtCrMn, CrMn, CtAl, ThCo, Ni-oxide, Fe-oxide, a mixture of Ni-oxide and Co-oxide, a mixture of Ni-oxide and Fe-oxide, double layers of Ni-oxide/Co-oxide, double layers of Ni-oxide/Fe-oxide, CoCr, CoCrPt, CoCrTa, PtCo, and preferably one of PtMn and PtMn with Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta.

As the passivation layer, there are available metals, oxides, nitrides, mixtures of oxides and nitrides, double layers of metal/oxide, double layers of metal/nitride, and double layers of metal/oxide-nitride mixture. For those double layers, there are available Ti, V, Cr, Co, Cu, Zn, Y, Zr, Y, Zr, Nb, Mo, Tc, Ru, Rh, Pd, Ag, Hf, Ta, W, Re, Os, Ir, Pt, Au, oxide of one of Si, Al, Ti, and Ta, nitride of one of Si, Al, Ti, and Ta, and mixtures of those oxides and nitrides, and also Ta, Hf, Zr, W, Cr, Ti, Mo, Pt, Ni, Ir, Cu, Ag, Co, Zn, Ru, Rh, Re, Au, Os, Pd, Nb, V, Y and alloys thereof.

The above novel magnetoresistive device was examined and results hereof will be described as follows.

EXAMPLE 1

A Ta base layer having a thickness of 3 nanometers was formed on a glass substrate A free magnetic layer having a thickness of 8 nanometers was formed on the Ta base layer. An aluminum oxide layer having a thickness of 2 nanometers was formed on the free magnetic layer A $Ni_{82}Fe_{18}$ layer having a thickness of 3 nanometers was formed on the aluminum oxide layer. A $Pt_{46}Mn_{54}$ layer having a thickness of 25 nanometers was formed on the $Ni_{82}Fe_{18}$ layer. A Ta layer having a thickness of 3 nanometers was formed on the $Pt_{46}Mn_{54}$ layer.

The above multilayer structure was formed by use of a DC magnetron sputtering system, wherein a film growth current is 0.1 A, and a gas pressure is 2 mm Torr. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause a natural oxidation of the aluminum film. Under a direct current magnetic field of 500 Oe, a heat treatment was carried out at a temperature of 250° C. for 5 hours. The ratio of variation in resistance of the magnetoresistive device is shown on Table 1.

TABLE 1

| Free magnetic layer | magnetoresistance rate (%) |
| --- | --- |
| Co (prior art) | 14 |
| $Ni_{82}Fe_{18}$ (prior art) | 9 |
| $Co_{84}Fe_9B_7$ | 18 |
| $Co_{82}Zr_9Mo_9$ | 16 |
| $Co_{92}Zr_6Nb_2$ | 19 |
| $Co_{98}Zr_7$ | 15 |
| $Co_{92}Zr_4Ta_4$ | 16 |
| $Co_{96}Hf_4$ | 16 |
| $Co_{95}Ta_5$ | 17 |
| $Co_{95}Ta_8Hf_2$ | 18 |
| $Co_{86}Fe_{10}Ti_4$ | 17 |
| $Co_{91}Nb_7Hf_7$ | 17 |
| $Co_{95}Hf_3Pd_2$ | 16 |
| $Co_{92}Ta_1Nb_6$ | 17 |
| $Co_{92}Zr_6Mo_1Nb_1$ | 17 |

Co free magnetic layer and NiFe magnetic layer correspond to the prior arts, whilst other free magnetic layers correspond to examples of the present invention. The novel magnetoresistive devices in accordance with the present invention show higher magnetoresistance rate than the conventional magnetoresistive devices.

EXAMPLE 2

In order to investigate the reason why the magnetoresistance rate is high, the following multilayer structure was formed A Ta layer having a thickness of 3 nanometers was formed on the glass substrate. A free magnetic layer having a thickness of 8 nanometers was formed on the Ta layer. A surface roughens of the above multilayer structure was observed by AFM. The surface roughness is represented by an averaged roughness Ra of the layer and is shown on the following Table 2. Further, the following multilayer structure was formed. A Ta layer having a thickness of 3 nanometers was formed on a glares substrate. A free magnetic layer having a thickness of 8 nanometers was formed on the Ta layer. An aluminum oxide layer having a thickness of 2 nanometers was formed on the free magnetic layer. An interface roughness between the free magnetic layer and the aluminum oxide layer was observed by an X-ray reflectivity measuring system, wherein an analysis is made to an X-ray profile from a total reflection critical angle which is generated by an incident X-ray at an extremely shallow angle into the sample surface. By those analysis, informations about the thickness, the interface roughness and the density are obtainable. The obtained X-ray profile informations are subjected to a simulation fitting to obtain a real number term and an imaginary number term of the reflective index, or obtain physical constants such as density and absorption. The surface roughness measured by AFM and the interface roughness measured by X-ray are shown on the following Table 2.

TABLE 2

| free magnetic layer | surface roughness (nm) | interface roughness (nm) |
| --- | --- | --- |
| Co (prior art) | 1 | 1.2 |
| $Ni_{82}Fe_{18}$ | 0.8 | 0.9 |
| $Co_{84}Fe_9B_7$ | 0.2 | 0.2 |
| $Co_{82}Zr_9Mo_9$ | 0.1 | 0.2 |
| $Co_{82}Zr_6Nb_2$ | 0.1 | 0.2 |

As compared to the Co free magnetic layer and the NiFe free magnetic layer, the novel free magnetic layers, for example, the CoFeB free magnetic layer, the CoZrNb free magnetic layer, the CoZrMo free magnetic layer are much more flat in the surface roughness and the interface roughness. Those materials are amorphous or fine crystals which contribute highly flat of the surface roughness and the interface roughness. The highly flat interface between the free magnetic layer and the aluminum oxide layer contributes uniformity in thickness of the aluminum oxide layer, whereby a leakage of current through the aluminum oxide layer is reduced and the magnetoresistance rate is improved. Other materials shown on the above Table 1 are also amorphous or fine crystal, for which reason the highly flat interface between the free magnetic layer and the aluminum oxide layer also contributes improvement in the magnetoresistance rate of the magnetoresistive device.

EXAMPLE 3

A Ta base layer having a thickness of 3 nanometers was formed on a glass substrate. A free magnetic layer having a thickness of 8 nanometers was formed on the Ta base layer. A $Co_{90}Fe_{10}$ layer having a thickness of 2 nanometers was formed on the free magnetic layer. An aluminum oxide layer having a thickness of 2 nanometers was formed on the $Co_{90}Fe_{10}$ layer. A $Ni_{82}Fe_{18}$ layer having a thickness of 3 nanometers was formed on the aluminum oxide layer. A $Pt_{46}Mn_{54}$ layer having a thickness of 25 nanometers was formed on the $Ni_{82}Fe_{18}$ layer. A Ta layer having a thickness of 3 nanometers was formed on the $Pt_{46}Mn_{54}$ layer.

The above multilayer structure was formed by use of a DC magnetron sputtering system, wherein a film growth current is 0.1A, and a gas pressure is 2 mm Torr. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause a natural oxidation of the aluminum film. Under a direct current magnetic field of 500 Oe, a heat treatment was carried out at a temperature of 250° C. for 5 hours. The ratio of variation in resistance of the magnetoresistive device is shown on Table 3.

TABLE 3

| Free magnetic layer | magnetoresistance rate (%) |
| --- | --- |
| Co (prior art) | 14 |
| $Ni_{82}Fe_{18}$ (prior art) | 13 |
| $Co_{84}Fe_9B_7$ | 24 |
| $Co_{82}Zr_9Mo_9$ | 23 |
| $Co_{92}Zr_6Nb_2$ | 24 |
| $Co_{98}Zr_7$ | 22 |
| $Co_{92}Zr_4Ta_4$ | 21 |
| $Co_{96}Hf_4$ | 21 |
| $Co_{95}Ta_5$ | 20 |
| $Co_{95}Ta_8Hf_2$ | 22 |
| $Co_{86}Fe_{10}Ti_4$ | 23 |
| $Co_{91}Nb_7Hf_7$ | 23 |
| $Co_{95}Hf_3Pd_2$ | 22 |
| $Co_{92}Ta_1Nb_6$ | 21 |
| $Co_{92}Zr_6Mo_1Nb_1$ | 21 |

Co free magnetic layer and NiFe magnetic layer correspond to the prior arts, whilst other free magnetic layers correspond to examples of the present invention. The novel magnetoresistive devices in accordance with the present invention show higher magnetoresistance rate than the conventional magnetoresistive devices.

EXAMPLE 4

A Ta base layer having a thickness of 3 manometers was formed on a glass substrate. A $Pt_{46}Mn_{54}$ layer having a thickness of 25 nanometers was formed on the Ta base layer. A pinned magnetic layer having a thickness of 5 nanometers was formed on the $Pt_{46}Mn_{54}$ layer. A $Co_{90}Fe_{10}$ layer having a thickness of 2 nanometers was formed on the pinned magnetic layer An aluminum oxide layer having a thickness of 2 nanometers was formed on the $Co_{90}Fe_{10}$ layer. A $Co_{90}Fe_{10}$ layer having a thickness of 2 nanometers was formed on the aluminum oxide layer. A free magnetic layer having a thickness of 3 nanometers was formed on the $Co_{90}Fe_{10}$ layer. A Ta layer having a thickness of 3 nanometers was formed on the free magnetic layer.

The above multilayer structure was formed by use of a DC magnetron sputtering system, wherein a film growth current is 0.1 A, and a gas pressure is 2 mm. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause a natural oxidation of the aluminum film. Under a direct current magnetic field of 500 Oe, a heat treatment was carried out at a temperature of 250° C. for 5 hours. The ratio of variation in resistance of the magnetoresistive device is shown on Table 4.

TABLE 4

| Free magnetic layer | Pinned magnetic layer | MR rate (%) |
| --- | --- | --- |
| Co (prior art) | $Ni_{82}Fe_{18}$ (prior art) | 13 |
| $Co_{84}Fe_9B_7$ | $Co_{84}Fe_9B_7$ | 23 |
| $Co_{84}Fe_9B_7$ | $Co_{82}Fe_9B_9$ | 22 |
| $Co_{84}Fe_9B_7$ | $Co_{92}Fe_6B_2$ | 22 |
| $Co_{82}Zr_7$ | $Co_{84}Fe_9B_7$ | 23 |
| $Co_{82}Zr_9Mo_9$ | $Co_{82}Zr_9Mo_9$ | 22 |
| $Co_{82}Zr_9Mo_9$ | $Co_{92}Zr_6Nb_7$ | 24 |
| $Co_{92}Zr_6Nb_2$ | $Co_{84}Fe_9B_7$ | 22 |
| $Co_{92}Zr_6Nb_2$ | $Co_{82}Zr_9Mo_9$ | 22 |
| $Co_{92}Zr_6Nb_2$ | $Co_{92}Zr_6Mo_2$ | 22 |

Co free magnetic layer and NiFe magnetic layer correspond to the prior arts, whilst other free magnetic layers correspond to examples of the present invention. The novel magnetoresistive devices in accordance with the present invention show higher magnetoresistance rate than the conventional magnetoresistive devices.

EXAMPLE 5

A Ta base layer having a thickness of 3 nanometers was formed on a glass substrate. A $Pt_{46}Mn_{54}$ layer having a thickness of 25 nanometers was formed on the Ta base layer. A pinned magnetic layer having a thickness of 5 nanometers was formed on the $Pt_{46}Mn_{54}$ layer. An aluminum oxide layer having a thickness of 2 nanometers was formed on the pinned magnetic layer. A $Co_{90}Fe_{10}$ layer having a thickness of 2 nanometers was formed on the aluminum oxide layer. A $Ni_{82}Fe_{18}$ layer having a thickness of 3 nanometers was formed on the $Co_{90}Fe_{10}$ layer. A Ta layer having a thickness of 3 nanometers was formed or the $Ni_{82}Fe_{18}$ layer.

The above multilayer structure was formed by use of a DC magnetron sputtering system, wherein a film growth current is 0.1 A, and a gas pressure is 2 mm Torr. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause a natural oxidation of the aluminum film. Under a direct current magnetic field of 500 Oe, a heat treatment was carried out at a temperature of 250° C. for 5 hours. The ratio of variation in resistance of the magnetoresistive device is shown on Table 5.

TABLE 5

| Free magnetic layer | magnetoresistance rate (%) |
| --- | --- |
| Co (prior art) | 15 |
| $Ni_{82}Fe_{18}$ (prior art) | 10 |
| $Co_{84}Fe_9B_7$ | 17 |
| $Co_{82}Zr_9Mo_9$ | 18 |
| $Co_{92}Zr_6Nb_2$ | 17 |
| $Co_{98}Zr_7$ | 16 |
| $Co_{92}Zr_4Ta_4$ | 17 |
| $Co_{96}Hf_4$ | 16 |
| $Co_{95}Ta_5$ | 16 |
| $Co_{95}Ta_8Hf_2$ | 17 |
| $Co_{86}Fe_{10}Ti_4$ | 16 |
| $Co_{91}Nb_7Hf_7$ | 18 |
| $Co_{95}Hf_3Pd_2$ | 17 |
| $Co_{92}Ta_1Nb_6$ | 17 |
| $Co_{92}Zr_6Mo_1Nb_1$ | 17 |

Co free magnetic layer and NiFe magnetic layer correspond to the prior arts, whilst other free magnetic layers correspond to examples of the present invention. The novel magnetoresistive devices in accordance with the present invention show higher magnetoresistance rate than the conventional magnetoresistive devices.

EXAMPLE 6

A Ta base layer having a thickness of 3 nanometers was formed on a glass substrate. A $Pt_{46}Mn_{54}$ layer having a thickness of 25 nanometers was formed on the Ta base layer. A pinned magnetic layer having a thickness of 5 nanometers was formed on the $Pt_{46}Mn_{54}$ layer. A $Co_{90}Fe_{10}$ layer having a thickness of 2 nanometers was formed an the pinned magnetic layer An aluminum oxide layer having a thickness of 2 nanometers was formed on the $Co_{90}Fe_{10}$ layer. A $Co_{90}Fe_{10}$ layer having a thickness of 2 nanometers was formed on the aluminum oxide layer. A free magnetic layer having a thickness of 3 nanometers was formed on the $Co_{90}Fe_{10}$ layer. A Ta layer having a thickness of 3 nanometers was formed on the free magnetic layer.

The above multilayer structure was formed by use of a DC magnetron sputtering system, wherein a film growth current is 0.1 A, and a gas pressure is 2 mm Torr. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause a natural oxidation of the aluminum film. Under a direct current magnetic field of 500 Oe, a heat treatment was carried out at a temperature of 250° C. for 5 hours. The ratio of variation in resistance of the magnetoresistive device is shown on Table 6.

TABLE 6

| Free magnetic layer | Pinned magnetic layer | MR rate (%) |
| --- | --- | --- |
| Co (prior art) | $Ni_{82}Fe_{18}$ (prior art) | 14 |
| $Co_{84}Fe_9B_7$ | $Co_{84}Fe_9B_7$ | 24 |
| $Co_{84}Fe_9B_7$ | $Co_{82}Zr_9Mo_9$ | 22 |
| $Co_{84}Fe_9B_7$ | $Co_{92}Fe_6B_2$ | 24 |
| $Co_{82}Zr_7Mo_9$ | $Co_{84}Fe_9B_7$ | 23 |
| $Co_{82}Zr_9Mo_9$ | $Co_{82}Zr_9Mo_9$ | 24 |
| $Co_{82}Zr_9Mo_9$ | $Co_{92}Zr_6Nb_2$ | 23 |
| $Co_{92}Zr_6Nb_2$ | $Co_{84}Fe_9B_7$ | 25 |
| $Co_{92}Zr_6Nb_2$ | $Co_{82}Zr_9Mo_9$ | 24 |
| $Co_{92}Zr_6Nb_2$ | $Co_{92}Zr_6Mo_2$ | 24 |

Co free magnetic layer and NiFe magnetic layer correspond to the prior arts, whilst other free magnetic layers correspond to examples of the present invention. The novel magnetoresistive devices in accordance with the present invention show higher magnetoresistance rate than the conventional magnetoresistive devices.

A seventh embodiment in accordance with the present invention will be described, wherein the magnetoresistive device is applied to the shield type device shown in FIG. 1. A NiFe bottom shield layer is used. The magnetoresistive device has the following multilayer structure. A $Pt_{46}Mn_{54}$ layer having a thickness of 25 nanometers was formed on a Ta base layer. A $Co_{92}Zr_6Nb_2$ layer having a thickness of 5 nanometers was formed on the $Pt_{46}Mn_{54}$ layer. A $Co_{90}Fe_{10}$ layer having a thickness of 2 nanometers was formed on the $Co_{92}Zr_6Nb_2$ layer. An aluminum oxide layer having a thickness of 2 nanometers was formed on the $Co_{90}Fe_{10}$ layer. A $Co_{90}Fe_{10}$ layer having a thickness of 2 nanometers was formed on the aluminum oxide layer. A $Co_{92}Zr_6Nb_2$ layer was formed on the $Co_{90}Fe_{10}$ layer. A Ta layer having a thickness of 3 nanometers was formed on the $Co_{92}Zr_6Nb_2$ layer.

The above multilayer structure was formed by use of a DC magnetron sputtering system, wherein a film growth current is 0.1 A, and a gas pressure is 2 mm Torr. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause a natural oxidation of the aluminum film. Under a direct current magnetic field of 500 Oe in a direction perpendicular to the magnetic field for growth of the layers, a heat treatment was carried out at a temperature of 250° C. for 5 hours.

The magnetoresistive layered structure is patterned to be 1×1 micrometers by a photo-resist process to form a magnetoresistive device. A CoCrPt layer is laminated in contact with an edge of the patterned magnetoresistive device. An NiFe top shield layer is formed. This head is formed to be a recording reproducing head. The recording reproducing head is positioned over a CoCrTa based medium for recording and reproducing data, wherein a writing track width is 1.5 micrometers, a writing gap is 0.2 micrometers and a reading out track width is 1.5 micrometers. A photo-resist curing process for forming coils of the writing head is carried out at a temperature of 250° C. and for two hours.

Through the above processes, magnetization directions of the pinned layer and the pinning layer have rotated from the direction of device height, even the magnetization directions should have to be parallel to the device height direction, whereby the magnetoresistive device has been made inoperable. After the reproducing head and the recording head have been completed, the a polarizing heat treatment is carried out at a temperature of 200° C. and a magnetic field of 500 Oe for one hour. Almost no rotation of the magnetization easy axis of the free magnetic layer toward the polarizing direction due to the polarizing beat treatment was observed. A cohesive force of the medium was 2.5 kOe. The reproducing output was measured by changing a recording mark. The recording reproducing output was 2.4 mV, and the signal to noise ratio was 29 dB. A mark length or frequency, where the reproducing output is reduced to be one half, is 239 kFCI. A bit error rate was not less than $1 \times 10^{-6}$. The good reproduced waveform could be obtained.

An eighth embodiment in accordance with the present invention will be described, wherein the magnetoresistive device is applied to the yoke type device shown in FIG. 8. A MnZn substrate is used. A silicon dioxide non-magnetic non-conductive layer is used. Aluminum oxide top and bottom non-magnetic layers are used. An Au electrode is used. A magnetic pole is used which has alternating lamination structure of a Ta layer having a thickness of 3 nanometers and a NiFe layer having a thickness of 10 nanometers, wherein a total thickness is 200 nanometers. The magnetoresistive device has the following multilayer structure. A $Pt_{46}Mn54$ layer having a thickness of 25 nanometers was formed on a Ta base layer having a thickness of 3 nanometers. A $Co_{82}Zr_9Nb_9$ layer having a thickness of 5 nanometers was formed on the $Pt_{46}Mn_{54}$ layer. A $Co_{90}Fe_{10}$ layer having a thickness of 2 nanometers was formed on the $Co_{82}Zr_9Nb_9$ layer. An aluminum oxide layer having a thickness of 2 nanometers was formed on the $Co_{90}Fe_{10}$ layer. A $Co_{90}Fe_{10}$ layer having a thickness of 2 nanometers was formed on the aluminum oxide layer. A $Co_{82}Zr_9Nb_9$ layer was formed on the $Co_{90}Fe_{10}$ layer. A Ta layer having a thickness of 3 nanometers was formed on the $Co_{82}Zr_9Nb_9$ layer.

The above multilayer structure was formed by use of a DC magnetron sputtering system, wherein a film growth current is 0.1 A, and a gas pressure is 2 Torr. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause a natural oxidation of the aluminum film. Under a direct current magnetic field of 500 Oe in a direction perpendicular to the magnetic field for growth of the layers, a heat treatment was carried out at a temperature of 250° C. for 5 hours The magnetoresistive layered structure is patterned to be 1×1 micrometers by a photo-resist process to form a magnetoresistive device. A CoCrPt layer is laminated in contact with an edge of the patterned magnetoresistive device. An NiFe top shield layer is formed. This head is formed to be a recording reproducing head. The recording reproducing head is positioned over a CoCrTa based medium for recording and reproducing data, wherein a writing track width is 1.5 micrometers, a writing gap is 0.2 micrometers and a reading out track width is 1.0 micrometers. A photo-resist curing process for forming coils of the writing head is carried out at a temperature of 250° C. and for two hours.

Through the above processes, magnetization directions of the pinned layer and the pinning layer have rotated from the direction of device height, even the magnetization directions should have to be parallel to the device height direction, whereby the magnetoresistive device has been made inoperable. After the reproducing head and the recording head have been completed, then a polarizing heat treatment is carried out at a temperature of 200° C. and a magnetic field of 500 Oe for one hour. Almost no rotation of the magnetization easy axis of the free magnetic layer toward the polarizing direction due to the polarizing heat treatment was observed. A cohesive force of the medium was 2.5 kOe. The reproducing output was measured by changing a recording mark. The recording reproducing output was 3.1 mV, and the signal to noise ratio was 34 dB. A mark length or frequency, where the reproducing output is reduced to be one half, is 277 kFCI. A bit error rate was not less than $1 \times 10^{-6}$. The good reproduced waveform could be obtained.

A ninth embodiment in accordance with the present invention will be described, wherein the magnetoresistive device is applied to the flux guide typo device shown in FIG. 9. NiFe to and bottom shield layers are used. An Au electrode is used. A magnetic pole is used which has alternating lamination structure of a Ta layer having a thickness of 3 nanometers and a NiFe layer having a thickness of 10 nanometers, wherein a total thickness is 200 nanometers. The magnetoresistive device has the following multilayer structure. A $Pt_{46}Mn_{54}$ layer having a thickness of 25 nanometers was formed on a Ta base layer having a thickness of 3 nanometers. A $Co_{84}Fe_9NB_7$ layer having a thickness of 5 nanometers was formed on the $Pt_{46}Mn54$ layer A $Co_{90}Fe_{10}$ layer having a thickness of 2 nanometers was formed on the $Co_{82}Zr_9Nb_7$ layer. An aluminum oxide layer having a thickness of 2 nanometers was formed on the $Co_{90}Fe_{10}$ layer. A $Co_{90}Fe_{10}$ layer having a thickness of 2 nanometers was formed on the aluminum oxide layer. A $Co_{84}Zr_9Nb_7$ layer was formed on the $Co_{90}Fe_{10}$ layer. A Ta layer having a thickness of 3 nanometers was formed on the $Co_{84}Zr_9Nb_7$ layer.

The above multilayer structure was formed by use of a DC magnetron sputtering system, wherein a film growth current is 0.1 A, and a gas pressure is 2 mm Torr. The aluminum oxide was formed by forming an aluminum film of 2 nanometers and subsequently introducing pure oxygen until a gas pressure of $2 \times 10^{-9}$ Torr in a vacuum chamber is increased up to $4 \times 10^{-4}$ Torr prior to leaving the same for one hour to cause, a natural oxidation of the aluminum film. Under a direct current magnetic field of 500 Oe in a direction perpendicular to the magnetic field for growth of the layers, a heat treatment was carried out at a temperature of 250° C. for 5 hours.

The magnetoresistive layered structure is patterned to be 1×1 micrometers by a photo-resist process to form a magnetoresistive device. A CoCrPt layer is laminated in contact with an edge of the patterned magnetoresistive device. An NiFe top shield layer is formed. This head is formed to be a recording reproducing head. The recording reproducing head is positioned over a CoCrTa based medium for recording and reproducing data, wherein a writing track width is 1.5 micrometers, a writing gap is 0.2 micrometers and a reading out track width is 1.0 micrometers A photo-resist curing process for forming coils of the writing head is carried out at a temperature of 250° C. and for two hours.

Through the above processes, magnetization directions of the pinned layer and the pinning layer have rotated from the direction of device height, even the magnetization directions should have to be parallel to the device height directions whereby the magnetoresistive device has been made inoperable. After the reproducing head and the recording head have been completed, then a polarizing heat treatment is carried out at a temperature of 200° C. and a magnetic field of 500 Oe for one hour. Almost no rotation of the magnetization easy axis of the free magnetic layer toward the polarizing direction due to the polarizing heat treatment was observed.

A cohesive force of the medium was 2.5 kOe. The reproducing output was measured by changing a recording mark. The recording reproducing output was 1.9 mV, and the signal to noise ratio was 28 dB. A mark length or frequency, where the reproducing output is reduced to be one half, is 287 kFCI. A bit error rate was not less than $1 \times 10^{-6}$. The good reproduced waveform could be obtained.

A tenth embodiment in accordance with the present invention will be described, a magnetic disk apparatus is provided which utilizes the above described present invention. The magnetic disk apparatus is provided with a base and three magnetic disks over a top surface of the base. Under a bottom of the base, a head driving circuit, a signal processing circuit and an input output interface are accommodated and connected through 32-bit bus line to outside. Magnetic heads are positioned to face to both surfaces of each of the magnetic disks. Namely, six heads are provided for the individual both surfaces of the three magnetic disks. A rotary actuator for driving the head, a driving circuit for the rotary actuator and a control circuit for the rotary actuator as well as a disk rotation spindle direct-coupled motor are accommodated. A diameter of the disks is 46 millimeters. A data face is defined in a range of a diameter from 10 millimeters to 40 millimeters. A buried servo system is used to have no exposed servo face, whereby it is possible to improve the high density.

This apparatus is directly connectable to a personal computer so that this apparatus serves as an external memory device. A cache memory is mounted on an input/output interface to respond to bus lines with a transfer rate of 5–20 M-bytes per one second. Further, an external controller is provided which is connected to a plurality of this apparatus, so that a large capacity magnetic disk apparatus can be realized.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An interface region of a magnetic layer to a non-magnetic non-conductive layer,
    wherein at least a first part of said interface region includes at least one material selected from the group consisting of CoFeB, CoZrMo, CoZrNb, CoZr, CoZrTa, CoHf, CoTa, CoTaHf, CoFeTi, CoNbHf, CoHfPd, CoTaZrNb, and CoZrMoNi,
    wherein at least a second part of said interface region includes an insulation layer disposed against side surfaces of said magnetic layer, said insulation layer being operative to confine a sense current into the magnetic layer to make the magnetic layer operate as a ferromagnetic tunnel junction layer,
    wherein at least a third part of said interface region includes a longitudinal bias layer in contact with a side edge of said magnetic layer, said longitudinal bias layer being operative to control magnetic domains of said magnetic layer to within a predetermined region,
    wherein said interface region includes a bottom electrode that is in contact with said magnetic layer,
    wherein said magnetic layer has a first region in a middle portion of said magnetic layer, a second region forming a first leg of said magnetic layer and disposed at one end of said magnetic layer, and a third region forming a second leg of said magnetic layer and disposed at another end of said magnetic layer, and
    wherein said longitudinal bias layer is at least partially disposed between the first leg of said magnetic layer and said bottom electrode.

2. The interface region as claimed in claim 1, wherein a first portion of said insulation layer is disposed directly above said first leg of said magnetic layer so that said first leg is sandwiched between said first portion of said insulation layer and said longitudinal bias layer, and wherein said insulation layer is not disposed directly above said middle portion of said magnetic layer, and
    wherein a second portion of said insulation layer is disposed directly above and in contact with said longitudinal bias layer.

* * * * *